(12) United States Patent
Kando et al.

(10) Patent No.: US 7,009,325 B2
(45) Date of Patent: Mar. 7, 2006

(54) SURFACE ACOUSTIC WAVE DEVICE

(75) Inventors: Hajime Kando, Kyoto-fu (JP); Michio Kadota, Kyoto-fu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 93 days.

(21) Appl. No.: 10/731,927

(22) Filed: Dec. 10, 2003

(65) Prior Publication Data

US 2004/0130239 A1    Jul. 8, 2004

(30) Foreign Application Priority Data

Jan. 7, 2003 (JP) .............................. 2003-001406
Sep. 19, 2003 (JP) .............................. 2003-328149

(51) Int. Cl.
*H01L 41/08* (2006.01)

(52) U.S. Cl. ............................. 310/313 A; 310/313 R; 310/363; 310/364

(58) Field of Classification Search ............ 310/313 R, 310/313 A, 313 B, 313 D, 360, 363, 36
See application file for complete search history.

(56) References Cited

U.S. PATENT DOCUMENTS

| 4,544,857 A | * | 10/1985 | Shimizu et al. ......... 310/313 B |
| 6,734,599 B1 | * | 5/2004 | Flowers et al. ......... 310/313 R |
| 6,791,237 B1 | * | 9/2004 | Yamanouchi ........... 310/313 R |

FOREIGN PATENT DOCUMENTS

JP         08-288788        11/1996

OTHER PUBLICATIONS

Takahiro Sato et al., "Longitudinal Leaky Surface Acoustic Wave on $Li_2B_4O_7$", O&E Components Division, Japan Energy Corp., p. 1-446, 1994.

Shigetaka Tonami et al., "Characteristics of Leaky Surface Acoustic Waves Propagating on $LiNbO_3$ and $LiTaO_3$ Substrates", Japanese Journal Applied Physics, vol. 34 (1995), pp. 2664-2667, Part I. No. 5B, May 1995.

* cited by examiner

*Primary Examiner*—Mark Budd
(74) *Attorney, Agent, or Firm*—Keating & Bennett, LLP

(57) ABSTRACT

A surface acoustic wave device using second leaky surface acoustic waves the dominant component of which is a longitudinal wave component includes a $LiTaO_3$ substrate and a conductive film formed on the $LiTaO_3$ substrate. The density $\rho$ of the conductive film is in the range of about 2,699 $kg/m^3$ to about 19,300 $kg/m^3$.

6 Claims, 13 Drawing Sheets

SURFACE ACOUSTIC WAVE DEVICE

BACKGROUND OF THE INVENTION

1. Field of the Invention

The present invention relates to a surface acoustic wave (SAW) device having a LiTaO$_3$ substrate. In particular, the present invention relates to a surface acoustic wave device using surface acoustic waves, the dominant component of which is longitudinal waves (pressure waves or P-waves), that have a phase velocity less than that of "fast shear waves" and "slow shear waves" of bulk acoustic waves (BAWs) propagating in the LiTaO$_3$ substrate.

2. Description of the Related Art

High-performance, light-weight, and small SAW devices are widely used in band-pass filters of portable communication devices. The operating frequency F of SAW devices is determined by F=V/L, wherein V is the phase velocity of the surface acoustic waves and L is the finger period of an interdigital transducer (IDT).

Accordingly, SAW devices having the same operating frequency have an increased finger period L if the phase velocity V is increased. Since the width of the electrode fingers of the IDT is increased as the finger period L increases, it is possible to manufacture SAW devices at high yield and low costs. However, when the period L is excessively large, the chip size increases and the number of SAW devices manufactured from one wafer decreases, thereby increasing the manufacturing costs.

On the other hand, when the phase velocity V decreases, the period L decreases, and the size of SAW devices is reduced. However, when the period L is excessively small, the width of the electrode fingers of the IDT becomes excessively small, thereby requiring costly micro-fabrication to make the IDT.

The phase velocity of the SAWs of the SAW devices must be optimized for their particular use. Moreover, recent communication devices having higher frequencies require higher operating voltages. Thus, SAW devices now require surface acoustic waves having higher phase velocities.

The bandwidth of resonator SAW filters, which are a category of SAW devices, is dependent upon the electromechanical coupling coefficient $k_S^2$. The electromechanical coupling coefficient $k_S^2$ increases as the bandwidth of the filter increases. Similarly, the electromechanical coupling coefficient $k_S^2$ decreases as the bandwidth of the filter decreases. Therefore, the electromechanical coupling coefficient $k_S^2$ must be optimized according to the usage. For example, radiofrequency (RF) SAW filters of cellular phones require an electromechanical coupling coefficient $k^{s2}$ of approximately 4% to 10%.

The loss resulting from propagation of surface acoustic waves, i.e., the propagation loss, increases insertion losses of SAW filters and the resonant resistance of the SAW resonators, and decreases the impedance in the impedance/antiresonant frequency ratio. Thus, the propagation loss is preferably as small as possible.

Known surface acoustic waves for use in SAW devices include Rayleigh waves and leaky waves, most of which have a higher phase velocity than Rayleigh waves. High-frequency SAW devices frequently use leaky waves which have a shear (transverse) wave component that is parallel to the SAW propagation direction, i.e., the u$_2$ component, as the dominant component and which propagate in 36°–42° Y-X lithium tantalate (LiTaO$_3$) substrates or 41° or 64° Y-X lithium niobate (LiNbO$_3$) substrates. Such leaky waves propagate at a velocity of approximately 4,000 to 4,500 m/sec in SAW devices having aluminum IDTs on these substrates.

Recently, second leaky surface acoustic waves, which have a higher phase velocity, i.e., approximately 5,000 to 7,000 m/sec, and which have a longitudinal wave component, i.e., the u$_1$ component, as the dominant component have drawn much attention.

A non-patent document entitled "Longitudinal Leaky Surface Acoustic Waves on Li$_2$B$_4$O$_7$", Shingaku Shunki Zendai A443 (1994), discloses leaky surface acoustic waves having a longitudinal-wave component as the dominant component and propagating in a lithium tetraborate substrate at a phase velocity of 6,656 m/sec. Another non-patent document entitled "Characteristics Of Leaky Surface Acoustic Wave Propagation On LiNbO$_3$ and LiTaO$_3$ Substrates", S. Tonami, Y. Shimizu, J. Appl. Phys. Vol. 34 (1995), pp. 2664–2667, discloses second leaky surface acoustic waves having a longitudinal wave component as the dominant component and propagating in LiNbO$_3$ and LiNbO$_3$ substrates. According to the latter non-patent document, the electromechanical coupling coefficient $k_S^2$ reaches the maximum, i.e., 2.41%, in a LiTaO$_3$ substrate with an Euler angle of (90°, 90°, 31°), and the propagation losses on a free surface which is electrically open (also referred to as the "open surface") and on an electrically short-circuited metallized surface (also referred to as the "short surface") are, respectively, approximately 0.06 dB/λ and approximately 0.5 dB/λ, wherein λ represents the wavelength of the second leaky surface acoustic waves. That is, the propagation loss is greater on the metallized surface than on the free surface. The temperature coefficients of delay (TCD) at the free surface and the metallized surface at the same Euler angle were, respectively, approximately 35 ppm and approximately 48 ppm.

Japanese Unexamined Patent Application Publication No. 8-288788 discloses a SAW device that uses longitudinal-wave-type SAWs in which the longitudinal component is dominant over the shear component. In particular, it discloses a SAW device including a LiTaO$_3$ or LiNbO$_3$ substrate cut at a particular Euler angle and a thin film disposed on the substrate, in which the product of the wave number K of the longitudinal SAWs and the thickness H of the thin film is controlled within a predetermined numerical range. For example, with a substrate composed of LiTaO$_3$ and a conductive thin film made of gold, longitudinal SAWs having a phase velocity less than those of "fast shear waves" and "slow shear waves" are effectively used to reduce the propagation loss to nearly zero by controlling KH to KH=0.6 (H/λ=9.6%) or more.

The "slow shear waves" and the "fast shear waves" are both bulk waves that propagate in a piezoelectric substrate. Three types of bulk waves that propagate in piezoelectric substrates are known as "slow shear waves", "fast shear waves", and "longitudinal waves". The conventional technologies described above teach that the longitudinal SAWs having a phase velocity less than those of the "fast shear waves" and "slow shear waves" have no propagation loss.

For the purpose of this specification, the "slow shear waves", the "fast shear waves", and the "longitudinal waves" are defined as follows. Shear waves (transverse waves) are categorized into vertical shear (SV) waves having a u$_3$ displacement component and horizontal shear (SH) waves having a u$_2$ displacement component. SV and SH waves having low acoustic velocities are defined as "slow shear waves" whereas SV and SH waves having high acoustic velocity are defined as "fast shear waves". Pressure waves or P-waves having a $u_1$ displacement component are the "longitudinal waves".

As described above, RF SAW filters of cellular phones require an electromechanical coupling coefficient $k_S^2$ of approximately 4% to 10%. However, the electromechanical coupling coefficient $k_S^2$ of a SAW device including a LiTaO$_3$ substrate and an aluminum conductive film is only approximately 2.13%.

Moreover, conductive films composed of aluminum require increased thickness. Thus, the yield is reduced.

On the other hand, the phase velocity of the longitudinal quasi SAWs disclosed in the above-described patent publication are decreased to approximately 3,300 m/sec, which is nearly the same as the velocity of the Rayleigh waves, to eliminate the propagation loss at the metallized surface. This is done by increasing the thickness of the gold conductive film so as to make the longitudinal quasi SAWs slower than the fast and slow shear waves. However, in this manner, the longitudinal waves no longer have a high phase velocity and cannot meet the requirements of higher frequency.

As is clear from the above description, conventional SAW devices using SAWs having longitudinal waves as the dominant component suffer from low electromechanical coupling coefficient $k_S^2$ and high propagation loss. Moreover, they are incompatible with higher phase velocities.

SUMMARY OF THE INVENTION

To overcome the problems described above, preferred embodiments of the present invention provide a SAW device having high electromechanical coupling coefficient, low propagation loss, and high phase velocity.

A first preferred embodiment of the present invention provides a surface acoustic wave device utilizing second leaky surface acoustic waves the dominant component of which is a longitudinal wave component, the device including a LiTaO$_3$ substrate, and a conductive film disposed on the LiTaO$_3$ substrate, wherein the density p of the conductive film is in the range of about 2,699 kg/m$^3$ to about 19,300 kg/m$^3$. Preferably, the normalized thickness H/λ of the conductive film is within the range of about $5.3023 \times \rho^{-0.4172}$ to about $80161 \times \rho^{-1.781}$ wherein λ represents the wavelength of the second leaky surface acoustic waves and H represents the thickness of the conductive film. In this manner the electromechanical coupling coefficient $k_S^2$ is further increased.

According to this structure, the electromechanical coupling coefficient $k_S^2$ of the second leaky SAWs is increased, variations in frequency resulting from manufacturing process are minimized, and the propagation loss is greatly reduced.

Preferably, the Euler angle of the LiTaO$_3$ substrate is in regions B1 to B4 shown in FIGS. 8 to 11 to achieve higher electromechanical coupling coefficient $k_S^2$.

The conductive film is preferably composed of copper, silver, or a metal mainly containing copper and/or silver to reduce the thickness of the conductive film.

A second preferred embodiment of the present invention provides a surface acoustic wave device using second leaky surface acoustic waves the dominant component of which is a longitudinal wave component, the device including a LiTaO$_3$ substrate having an Euler angle within regions A1 to A10 defined by connecting the coordinates shown in Tables 3 and 4, and a conductive film disposed on the LiTaO$_3$ substrate, wherein the density ρ of the conductive film is greater than about 2,699 kg/m$^3$ and the normalized thickness H/λ of the conductive film is within the range of about $5.3023 \times \rho^{-0.4172}$ to about $80161 \times \rho^{-1.781}$, wherein λ represents the wavelength of the second leaky surface acoustic waves and H represents the thickness of the conductive film:

TABLE 3

| Region | Coordinates | θ | ψ |
|---|---|---|---|
| A1 | P1 | 16.2 | 63.7 |
|  | P2 | 69.9 | 63.7 |
|  | P3 | 69.9 | 116.3 |
|  | P4 | 16.2 | 116.3 |
|  | P5 | 16.2 | 63.7 |
| A2 | P1 | 106.2 | 118.7 |
|  | P2 | 143.6 | 118.7 |
|  | P3 | 143.6 | 151.4 |
|  | P4 | 106.2 | 151.4 |
|  | P5 | 106.2 | 118.7 |
| A3 | P1 | 106.2 | 28.6 |
|  | P2 | 143.6 | 28.6 |
|  | P3 | 143.6 | 61.3 |
|  | P4 | 106.2 | 61.3 |
|  | P5 | 106.2 | 28.6 |
| A4 | P1 | 16.5 | 55.9 |
|  | P2 | 72.3 | 55.9 |
|  | P3 | 72.3 | 108.0 |
|  | P4 | 16.5 | 108.0 |
|  | P5 | 16.5 | 55.9 |
| A5 | P1 | 106.2 | 131.3 |
|  | P2 | 124.0 | 131.3 |
|  | P3 | 124.0 | 148.0 |
|  | P4 | 106.2 | 148.0 |
|  | P5 | 106.2 | 131.3 |

TABLE 4

| Region | Coordinates | θ | ψ |
|---|---|---|---|
| A6 | P1 | 106.3 | 30.8 |
|  | P2 | 153.1 | 30.8 |
|  | P3 | 153.1 | 71.7 |
|  | P4 | 106.3 | 71.7 |
|  | P5 | 106.3 | 30.8 |
| A7 | P1 | 17.4 | 48.5 |
|  | P2 | 76.8 | 48.5 |
|  | P3 | 76.8 | 99.4 |
|  | P4 | 17.4 | 99.4 |
|  | P5 | 17.4 | 48.5 |
| A8 | P1 | 104.6 | 35.6 |
|  | P2 | 158.0 | 35.6 |
|  | P3 | 158.0 | 81.3 |
|  | P4 | 104.6 | 81.3 |
|  | P5 | 104.6 | 35.6 |
| A9 | P1 | 19.1 | 41.7 |
|  | P2 | 78.3 | 41.7 |
|  | P3 | 78.3 | 90.4 |
|  | P4 | 19.1 | 90.4 |
|  | P5 | 19.1 | 41.7 |
| A10 | P1 | 101.7 | 41.7 |
|  | P2 | 161.0 | 41.7 |
|  | P3 | 161.0 | 90.4 |
|  | P4 | 101.7 | 90.4 |
|  | P5 | 101.7 | 41.7 |

According to the second preferred embodiment of the present invention, the electromechanical coupling coefficient $k_S^2$ of the second leaky surface acoustic waves is increased, variations in frequency resulting from manufacturing process are minimized, and the propagation loss is greatly reduced.

The conductive film preferably includes at least one of copper, silver, and gold.

The conductive films described above define various electrodes, such as IDTs and grating reflectors.

The SAW device according to preferred embodiments of the present invention utilizing the second leaky SAWs has a high electromechanical coupling coefficient, low propagation loss, and high performance. Moreover, variations in frequency resulting from the production process are minimized, and complicated frequency adjustment steps are omitted.

Further elements, characteristics, features and advantages of the present invention will become apparent from the following description of the preferred embodiments with reference to the attached drawings.

DETAILED DESCRIPTION OF PREFERRED EMBODIMENTS

Figure 1:
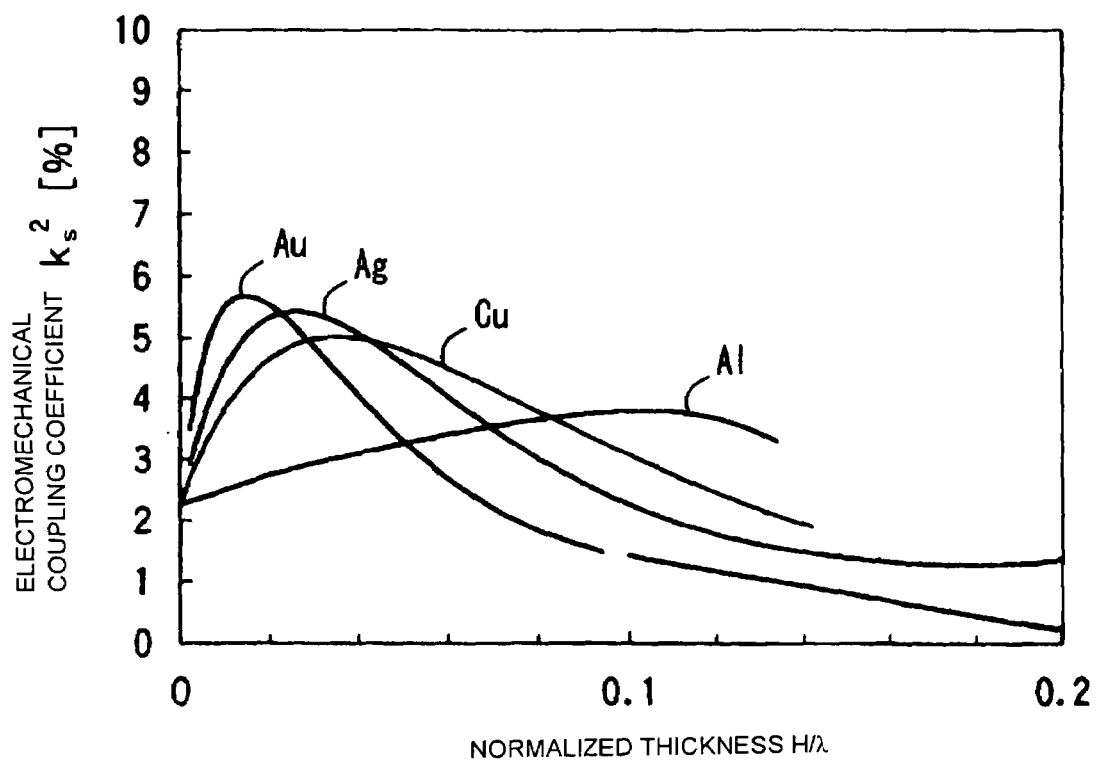
FIG. 1 is a graph showing changes in electromechanical coupling coefficient $k_S^2$ of second leaky SAWs, which have the $u_1$ component as the dominant component and which propagate in structures that include aluminum, gold, silver, and copper conductive films on (90°, 90°, 31°)-cut LiTaO$_3$ substrates, the electromechanical coupling coefficient $k_S^2$ being plotted against a normalized thickness H/λ of the conductive film.

For the purpose of this specification, terms are defined as follows.

"Surface acoustic waves having longitudinal waves as the main component": "Surface acoustic waves having longitudinal waves as the main component" is a broad term that includes quasi longitudinal surface acoustic waves described in Japanese Unexamined Patent Application Publication No. 8-288788, in which the longitudinal component is dominant over the transverse component; longitudinal electroacoustic waves (longitudinal shear waves), second leaky surface acoustic waves; and other waves. In particular, longitudinal-type SAWs whose dominant component is longitudinal waves having a phase velocity that is less than those of the slow and fast shear waves are also included in the definition.

"Euler angle": This term refers to a right-handed system Euler angle (φ, θ, ψ) that indicates the cutting plane of a substrate and a propagation direction of SAWs as defined in "Danseiha Soshi Gijutu Handobukku (Surface Acoustic Waves Devices Technical Handbook)", Japan Society for the Promotion of Science, SAW device Technology 150 Committee, First Edition, Nov. 30, 1991, p. 549.

"Crystal Axes": The X, Y, and Z axes of the LiTaO$_3$ crystal given as the default values of the Euler angle are as follows: the Z axis is parallel to the c axis, the X axis is parallel to a predetermined one of a axes that extend in three equivalent directions, and the Y axis is normal to the X-Z plane.

"Displacement Component": The displacement components are indicated as $u_1$, $u_2$, and $u_3$. $u_1$ indicates the displacement in the X axis direction, $u_2$ indicates the displacement in the Y axis direction, and $u_3$ indicates the displacement in the Z axis direction. The above-described second leaky SAWs are also referred to as the "longitudinal leaky SAWs having the $u_1$ component as the dominant component".

"Equivalent Euler Angle": Equivalent Euler Angles are crystallographically equivalent Euler angles ($\phi$, $\theta$, $\psi$) of the LiTaO$_3$ substrate. According to Acoustical Science and Technology, Vol. 36, No. 3 (1980), pp. 140–145, the following relationships (A) are established in LiNbO$_3$, which belongs to a trigonal 3 m point group:

$$\begin{aligned} F(\phi, \theta, \psi) &= F(60° - \phi, -\theta, \psi) \\ &= F(60° + \phi, -\theta, 180° - \psi) \\ &= F(\phi, 180° + \theta, 180° - \psi) \\ &= F(\phi, \theta, 180° + \psi) \end{aligned} \quad (A)$$

wherein F represents a particular SAW property, such as electromechanical coupling coefficient, propagation loss, temperature coefficient of delay (TCD), power flow angle (PFA), or natural unidirectionality, dependent on the Euler angle. Although the signs of the PFA and the natural unidirectionality change when the propagation direction is reversed, the absolute values remain unchanged. For example, the SAW propagation property at an Euler angle (30°, $\theta$, $\psi$) is equivalent to that at an Euler angle (90°, 180°-$\theta$, 180°-$\psi$). The SAW propagation property at an Euler angle (30°, 90°, 45°) is equivalent to the SAW propagation properties at the following Euler angles shown in Table 5.

TABLE 5

| $\phi$ [°] | $\theta$ [°] | $\psi$ [°] |
|---|---|---|
| 30 | 90 | 225 |
| 30 | 270 | 135 |
| 30 | 270 | 315 |
| 90 | 90 | 135 |
| 90 | 90 | 315 |
| 90 | 270 | 45 |
| 90 | 270 | 225 |
| 150 | 90 | 45 |
| 150 | 90 | 225 |
| 150 | 270 | 135 |
| 150 | 270 | 315 |
| 210 | 90 | 135 |
| 210 | 90 | 315 |
| 210 | 270 | 45 |
| 210 | 270 | 225 |
| 270 | 90 | 45 |
| 270 | 90 | 225 |
| 270 | 270 | 135 |
| 270 | 270 | 315 |
| 330 | 90 | 135 |
| 330 | 90 | 315 |
| 330 | 270 | 45 |
| 330 | 270 | 225 |

Preferred embodiments of the present invention will now be further described with reference to examples.

The propagation properties of SAWs, whose dominant component is longitudinal waves, on a metallized surface and a free surface were examined by general analytical methods such as those reported in "A Method For Estimating Optimal Cuts And Propagation Directions For Excitation And Propagation Directions For Excitation Of Piezoelectric Surface Waves" (J. J. Campbell and W. R. Jones, IEEE Trans. Sonics and Ultrason., Vol. SU-15 (1968), pp. 209–217) and "Giji Dansei Hyoumenha Kaiseki Ni Okeru Housha Joken No Toriatsukai Ni Tsuite (Radiation Conditions In Quasi Surface Acoustic Wave Analysis)" (Hashimoto et al., Technical Report of the Institute of Electronics, Information, and Communication Engineers, US95-46, 1995-09, pp. 25–30).

The propagation properties on a free surface were determined given that the conductivity of the conductive film was 0 and the relative dielectric constant was 1.

FIG. 1 is a graph showing changes in electromechanical coupling coefficient $k_S^2$ of second leaky SAWs primarily composed of $u_1$ component propagating in structures having various conductive films on (90°, 90°, 31')-cut LiTaO$_3$ substrates. The electromechanical coupling coefficient $k_S^2$ was plotted relative to a normalized thickness H/$\lambda$, wherein H represents the thickness of the conductive film and $\lambda$ represents the wavelength of the surface acoustic waves primarily composed of the $u_1$ component. As shown in the graph, aluminum, gold, silver, and copper were used as the materials of the conductive films.

Figure 2:
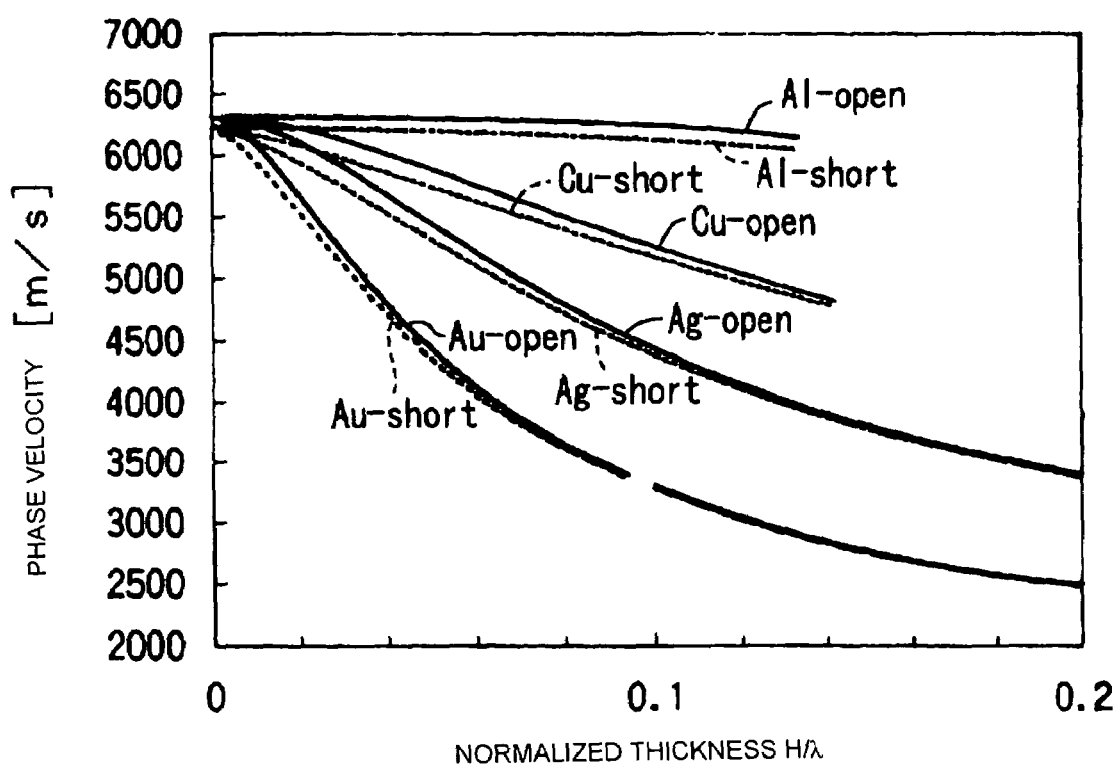
FIG. 2 shows phase velocities Vm on a metallized surface and phase velocities Vf on a free surface in the structures including aluminum, gold, silver, and copper conductive films on (90°, 90°, 31°)-cut LiTaO$_3$ substrates, the velocities being plotted against the normalized thickness of H/λ of the conductive films.

The phase velocity Vm on the metallized surface and the phase velocity Vf on the free surface in these structures were also determined. The results are shown in FIG. 2.

Note that for the purpose of this specification, the "dominant displacement component" refers to the displacement component having the maximum displacement within a depth of 3$\lambda$ from the substrate surface.

FIG. 1 shows that the electromechanical coupling coefficient $k_S^2$ reached a maximum value when the conductive film had a particular thickness in all structures that used various metals. Table 6 below shows the density of the conductive film, the normalized thickness H/$\lambda$ at which the electromechanical coupling coefficient $k_S^2$ was at the maximum value, and the maximum value of the electromechanical coupling coefficient $k_S^2$. The normalized thickness H/$\lambda$ at which the electromechanical coupling coefficient $k_S^2$ was at the maximum decreased with increasing density of the conductive film. The maximum value of the electromechanical coupling coefficient $k_S^2$ increased with increasing density of the conductive film.

These results show that the normalized film thickness H/$\lambda$ must be increased to approximately 0.1 in order to achieve a large electromechanical coupling coefficient $k_S^2$ with an aluminum conductive film. However, when forming electrodes, such as IDTs and grating reflectors, on LiTaO$_3$ substrates, the difference between the line width of the electrode fingers and the thickness decreases and the aspect ratio of the electrode increases if the thickness H/$\lambda$ is excessively large. As a result, etching failure readily occurs when the electrodes are formed by dry etching. Moreover, when the electrodes are formed by a lift-off process, formation of the resist layer is difficult. Thus, the normalized thickness H/$\lambda$ of the conductive film is preferably no more than about 0.1.

Gold provides the largest electromechanical coupling coefficient $k_S^2$ and is thus preferred when high performance is required. However, inexpensive copper and silver, which provide nearly as large electromechanical coupling coefficient $k_S^2$, is preferred over expensive gold from the industrial standpoint.

TABLE 6

| Conductive film | Density ρ [kg/m³] | H/λ with maximum $k_s^2$ | Maximum $k_s^2$ [%] |
|---|---|---|---|
| Al | 2,699 | 0.102 | 3.8 |
| Cu | 8,930 | 0.034 | 5.0 |
| Ag | 10,500 | 0.026 | 5.4 |
| Au | 19,300 | 0.014 | 5.7 |

As shown in FIG. 2, the higher the density of the conductive film, the larger the rate of change in acoustic velocity relative to the normalized thickness H/λ. Larger rates of change in acoustic velocity relative to the normalized thickness H/λ cause an increase in frequency variation resulting from variations in thickness during manufacture of SAW devices. When the frequency variation is large, wafers and/or conductive films must be etched by dry etching or ion milling so as to adjust the frequency. However, frequency adjustment is costly. Thus, a frequency adjustment step is preferably omitted from the manufacture process. According to the investigations of preferred embodiments of the present invention, frequency adjustment is inevitable when gold conductive films are used.

In view of the above, the electromechanical coupling coefficient $k_s^2$ is increased by using a material having a density that is higher than that of aluminum. Although gold conductive films are preferred in uses that require high performance, materials having less density than gold are preferred for uses that require both cost efficiency and performance. Accordingly, the material of the conductive film preferably has a density of more than about 2,699 kg/m³ to achieve sufficient performance and electromechanical coupling coefficient $k_s^2$, but less than about 19,300 kg/m³ so as not to necessitate frequency adjustment. Such a material reduces the cost of SAW devices. Examples of such materials include titanium, zinc, chromium, copper, silver, platinum, iron, nickel, tantalum, and tungsten.

Figure 3:
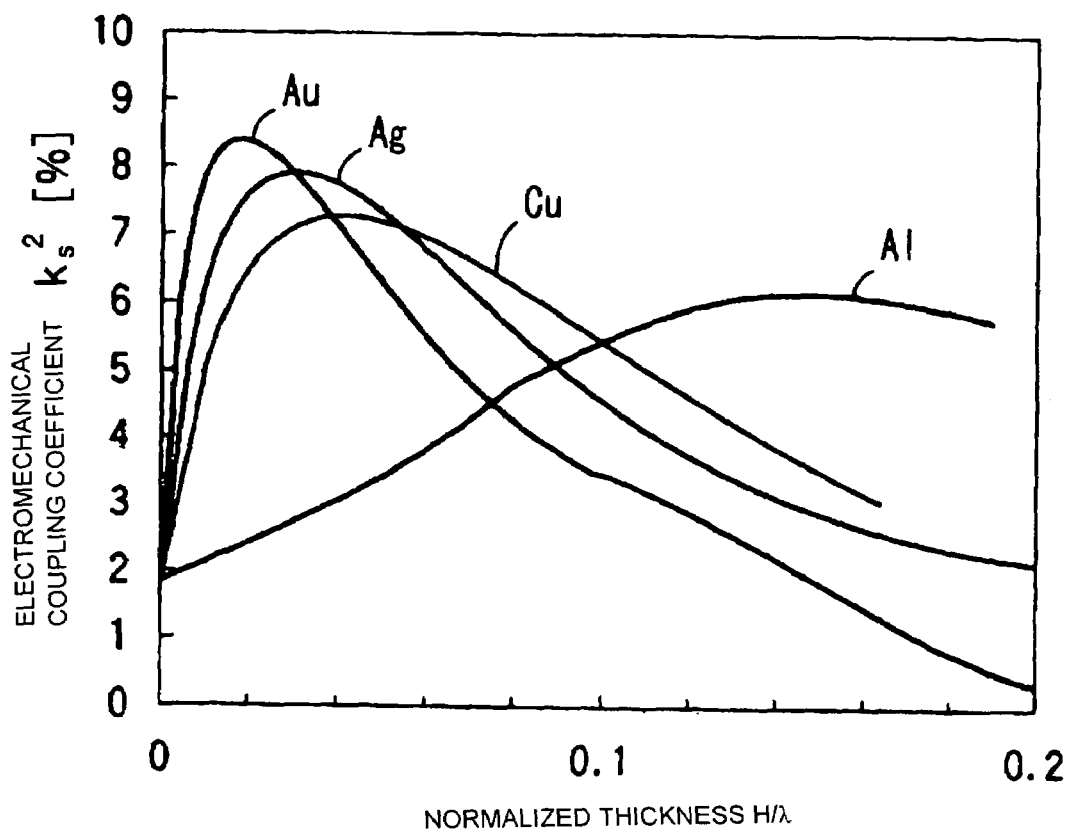
FIG. 3 is a graph showing changes in electromechanical coupling coefficient $k_S^2$ of second leaky SAWs, which have the $u_1$ component as the dominant component and which propagate in structures including aluminum, gold, silver, and copper conductive films on (90°, 31°, 116°)-cut LiTaO$_3$ substrates, the electromechanical coupling coefficient $k_S^2$ being plotted against the normalized thickness H/λ of the conductive films.
Figure 4:
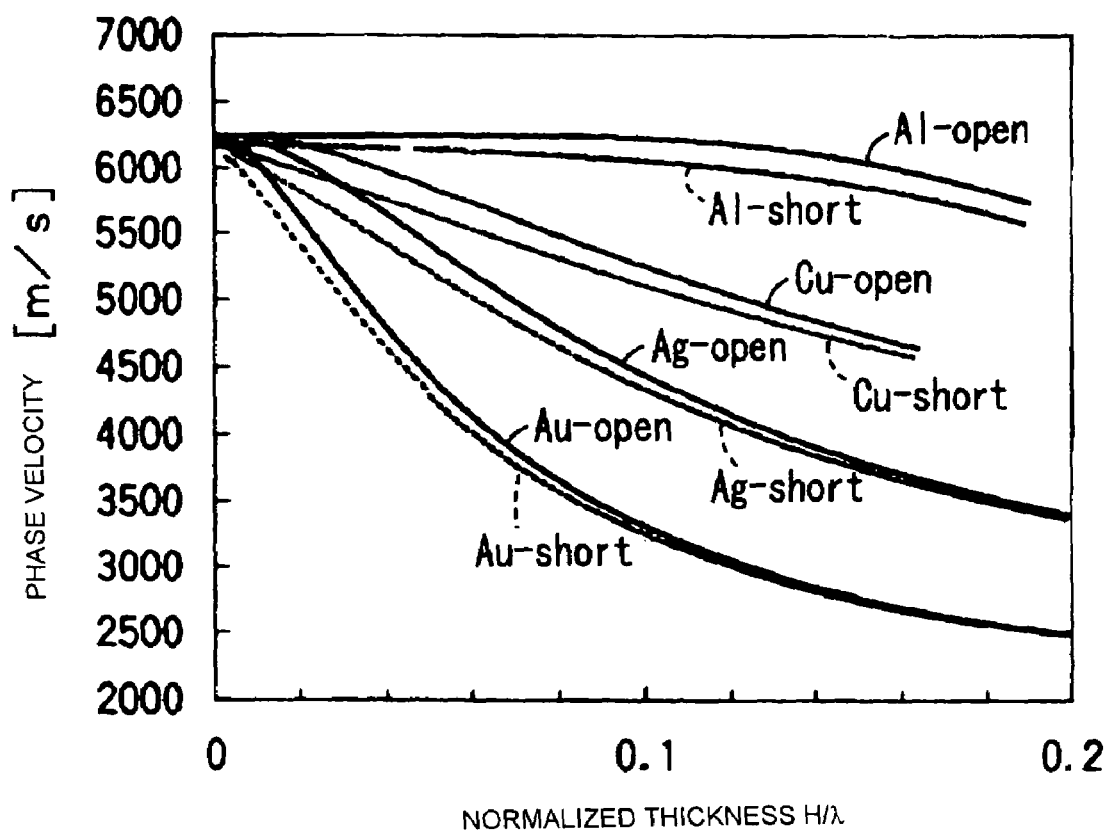
FIG. 4 shows phase velocities Vm on the metallized surface and phase velocities Vf on the free surface in the structures that include aluminum, gold, silver, and copper conductive films on (90°, 31°, 116°)-cut LiTaO$_3$ substrates, the velocities being plotted against the normalized thickness H/λ of the conductive films.
Figure 5:
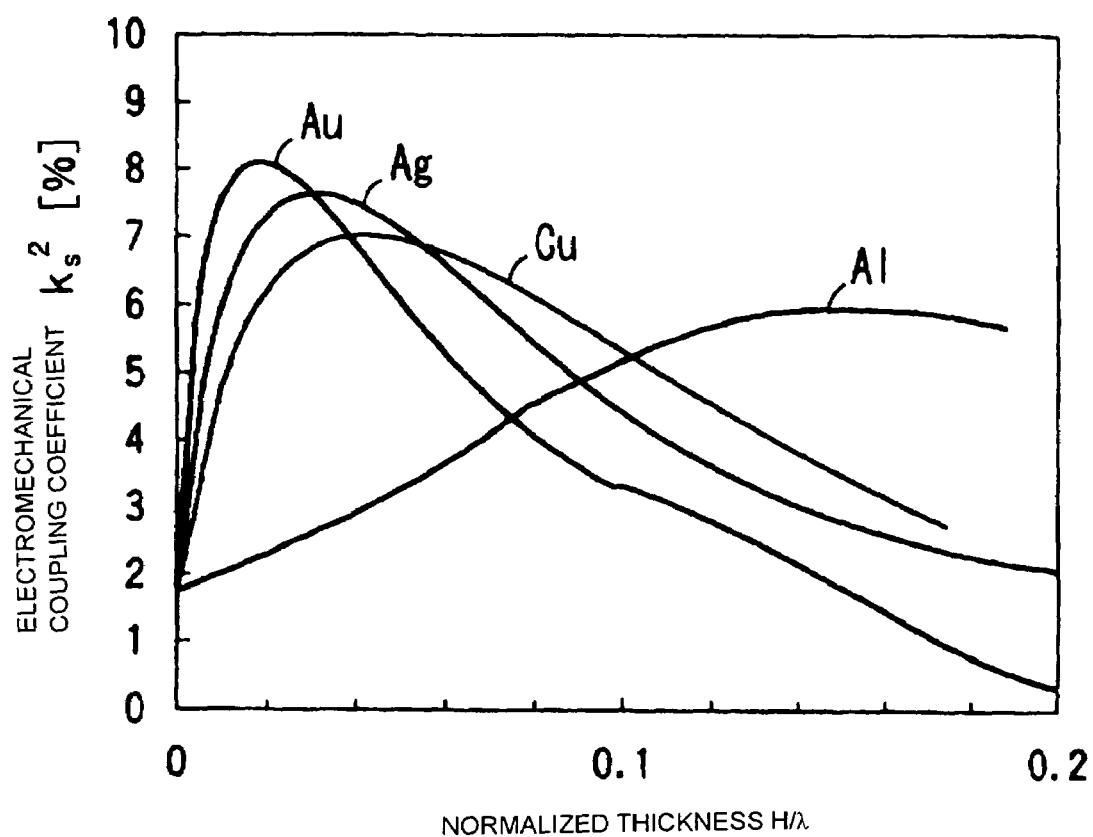
FIG. 5 is a graph showing changes in electromechanical coupling coefficient $k_S^2$ of second leaky SAWs, which have the $u_1$ component as the dominant component and which propagate in structures including aluminum, gold, silver, and copper conductive films formed on (0°, 28°, 90°)-cut LiTaO$_3$ substrates, the electromechanical coupling coefficient $k_S^2$ being plotted against the normalized thickness H/λ of the conductive films.
Figure 6:
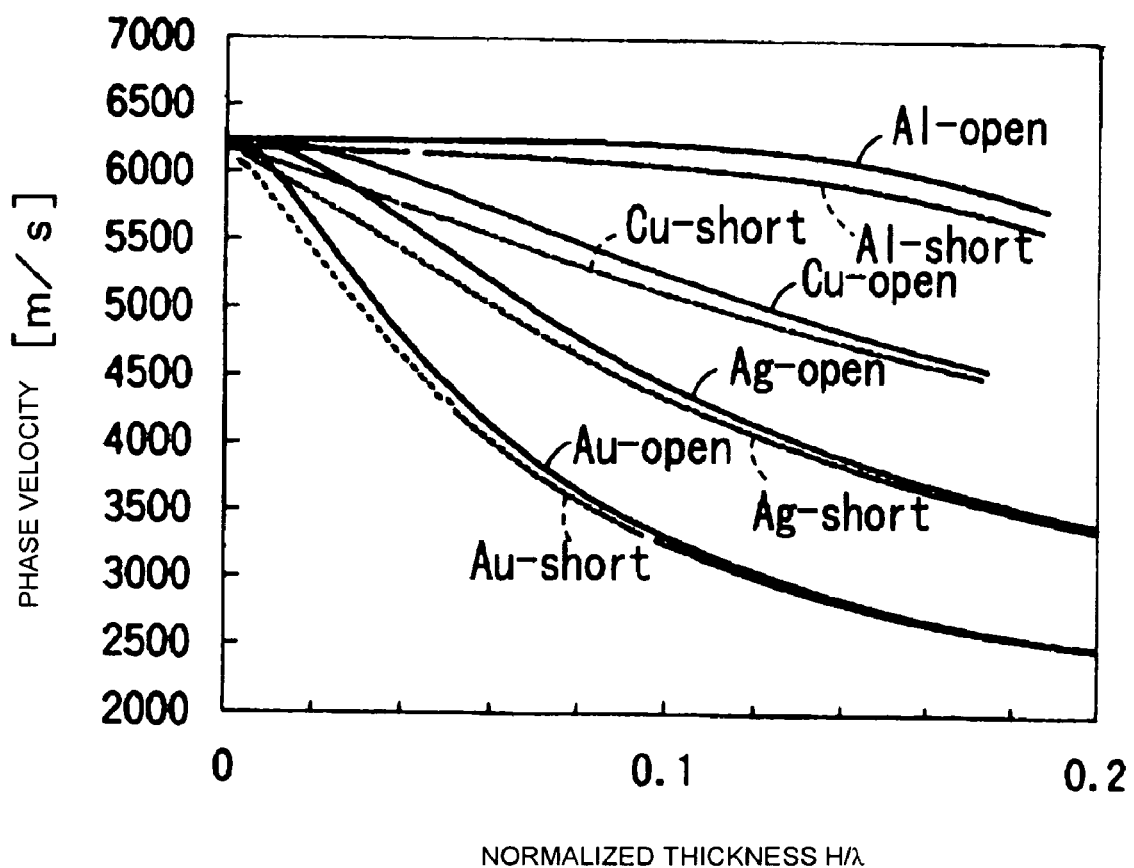
FIG. 6 shows phase velocities Vm on the metallized surface and phase velocities Vf on the free surface in the structures that include aluminum, gold, silver, and copper conductive films on (0°, 28°, 90°)-cut LiTaO$_3$ substrates, the velocities being plotted against the normalized thickness H/λ of the conductive films.

FIG. 3 is a graph showing changes in electromechanical coupling coefficient $k_s^2$ of second leaky SAWs primarily composed of $u_1$ component propagating in structures having aluminum, gold, silver, and copper conductive films on (90°, 31°, 116°)-cut LiTaO₃ substrates. The electromechanical coupling coefficient $k_s^2$ was plotted relative to a normalized thickness H/λ of the conductive film. FIG. 4 shows the phase velocity Vm on the metallized surface and the phase velocity Vf on the free surface in these structures. FIG. 5 is a graph showing changes in electromechanical coupling coefficient $k^{s2}$ of second leaky SAWs mainly composed of $u_1$ component propagating in structures having aluminum, gold, silver, and copper conductive films on (0°, 28°, 90°)-cut LiTaO₃ substrates. FIG. 6 is a graph showing the phase velocity Vm on the metallized surface and the phase velocity Vf on the free surface in these structures.

As is apparent from FIGS. 3 and 5, the maximum electromechanical coupling coefficient $k_s^2$ can be increased from "4% to 6%" to "6% to 8%" by cutting the LiTaO₃ substrate at Euler angles of (90°, 31°, 116°) and (0°, 28°, 90°). The rate of change in acoustic velocity remains the same.

Figure 7:
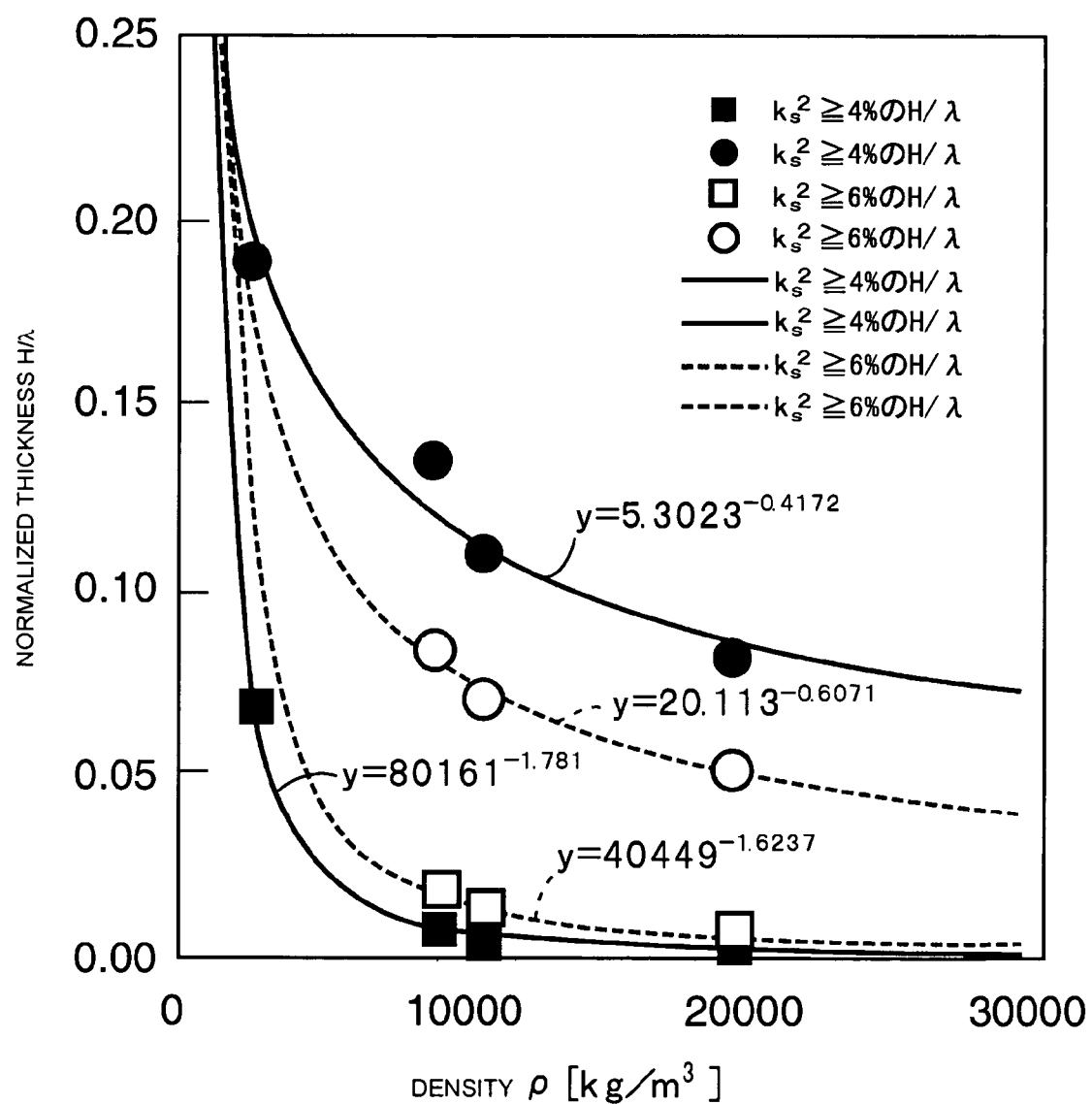
FIG. 7 is a graph showing the relationships among a density p of the conductive film and normalized thicknesses H/λ that achieve an electromechanical coupling coefficient $k^{s2}$ of at least about 4% and at least about 6%.

Table 7 below shows the density of the conductive film, the normalized thickness H/λ of the conductive film at which the electromechanical coupling coefficient $k_s^2$ was at the maximum, the maximum value of the electromechanical coupling coefficient $k_s^2$, the normalized thickness H/λ at which the electromechanical coupling coefficient $k_s^2$ was at least about 4%, and the normalized thickness H/λ at which the electromechanical coupling coefficient $k_s^2$ was at least about 6% at an Euler angle of (90°, 31°, 116°). FIG. 7 is a graph showing the relationship among the density ρ of the conductive film, the normalized thickness H/λ at which the electromechanical coupling coefficient $k_s^2$ was at least about 4%, and the normalized thickness H/λ at which the electromechanical coupling coefficient $k_s^2$.

TABLE 7

| Conductive film | Density ρ [kg/m³] | H/λ at maximum $k_s^2$ | Maximum $k_s^2$ [%] | H/λ at $k_s^2 \geq 4\%$ | H/λ at $k_s^2 \geq 6\%$ |
|---|---|---|---|---|---|
| Al | 2,699 | 0.148 | 5.945 | 0.068 < H/λ < 0.188 | — |
| Cu | 8,930 | 0.042 | 7.02 | 0.007 < H/λ < 0.135 | 0.018 < H/λ < 0.083 |
| Ag | 10,500 | 0.032 | 7.633 | 0.004 < H/λ < 0.110 | 0.010 < H/λ < 0.070 |
| Au | 19,300 | 0.018 | 8.102 | 0.002 < H/λ < 0.081 | 0.005 < H/λ < 0.051 |

Based on Table 7, the conditions required to increase the electromechanical coupling coefficient $k_s^2$ to at least about 4% are indicated by the region between equation (1) and equation (2) below:

$$H/\lambda = 5.3023 \times \rho^{-0.4172} \quad (1)$$

$$H/\lambda = 80161 \times \rho^{-1.781} \quad (2)$$

The conditions required to increase the electromechanical coupling coefficient $k_s^2$ to at least about 6% are indicated by the region between equation (3) and equation (4) below:

$$H/\lambda = 20.113 \times \rho^{-0.6071} \quad (3)$$

$$H/\lambda = 40449 \times \rho^{-1.6237} \quad (4)$$

As shown in FIGS. 1 and 5, although the maximum value of the electromechanical coupling coefficient $k_s^2$ may change at other Euler angles such as (90°, 90°, 31°) or (0°, 28°, 90°), the optimum conditions of H/λ of the conductive film that increases the electromechanical coupling coefficient $k_s^2$ are presumably substantially the same as those indicated by equations (1) to (4). This presumption is derived from the comparison with the results at an Euler angle of (90°, 31°, 116°) shown in FIG. 3.

Furthermore, conditions for further increasing the electromechanical coupling coefficient $k_s^2$ were investigated with LiTaO₃ substrates cut at various Euler angles.

Figure 8:
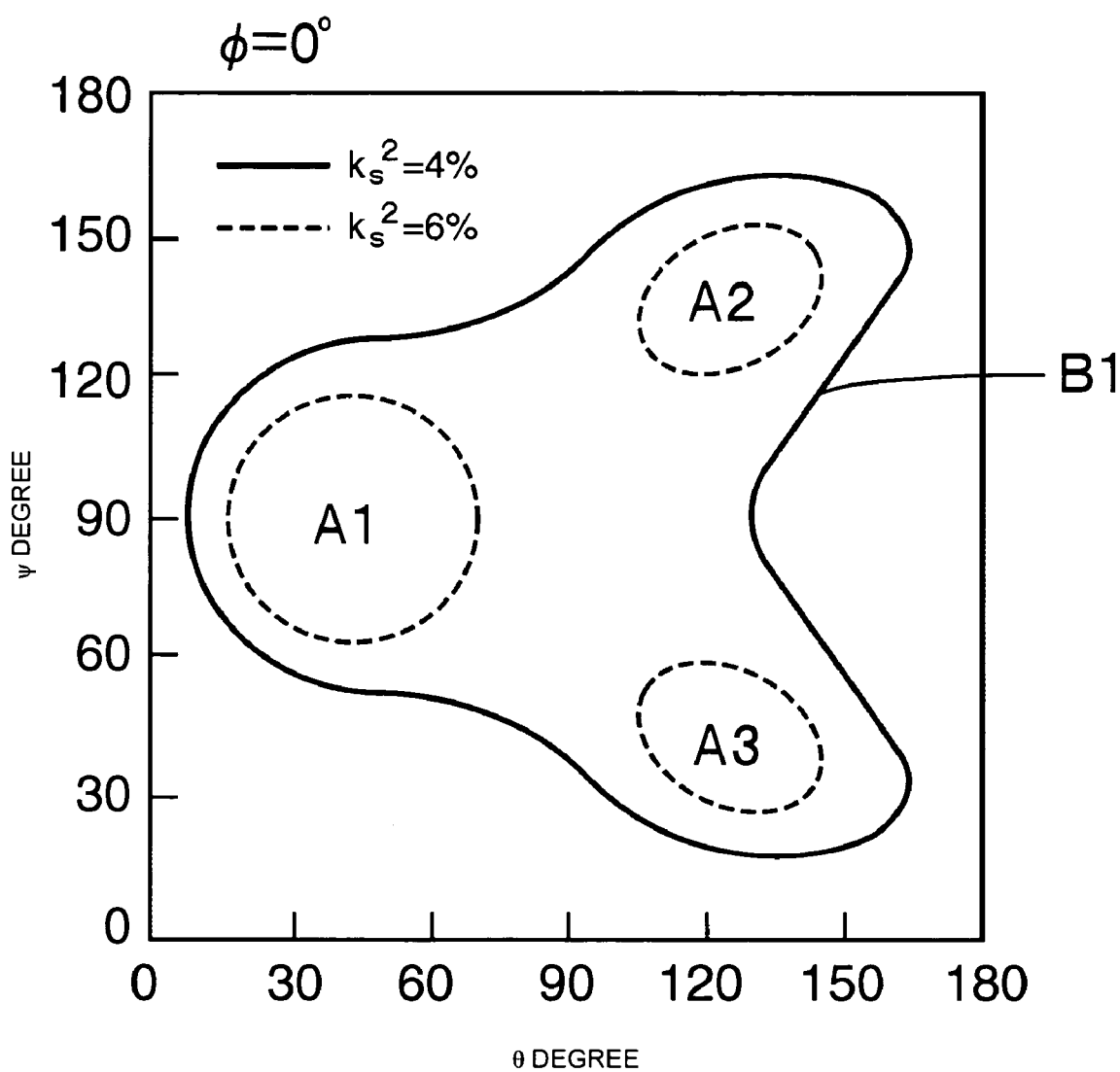
FIG. 8 illustrates regions of Euler angles at which the electromechanical coupling coefficient $k_S^2$ of second leaky surface acoustic waves having the $u_1$ component as the dominant component is at least about 4% and at least about 6%, the second leaky surface acoustic waves propagating in a structure that includes a (0°, θ, ψ)-cut LiTaO$_3$ substrate and a silver conductive film having a normalized thickness H/λ of about 0.03.
Figure 9:
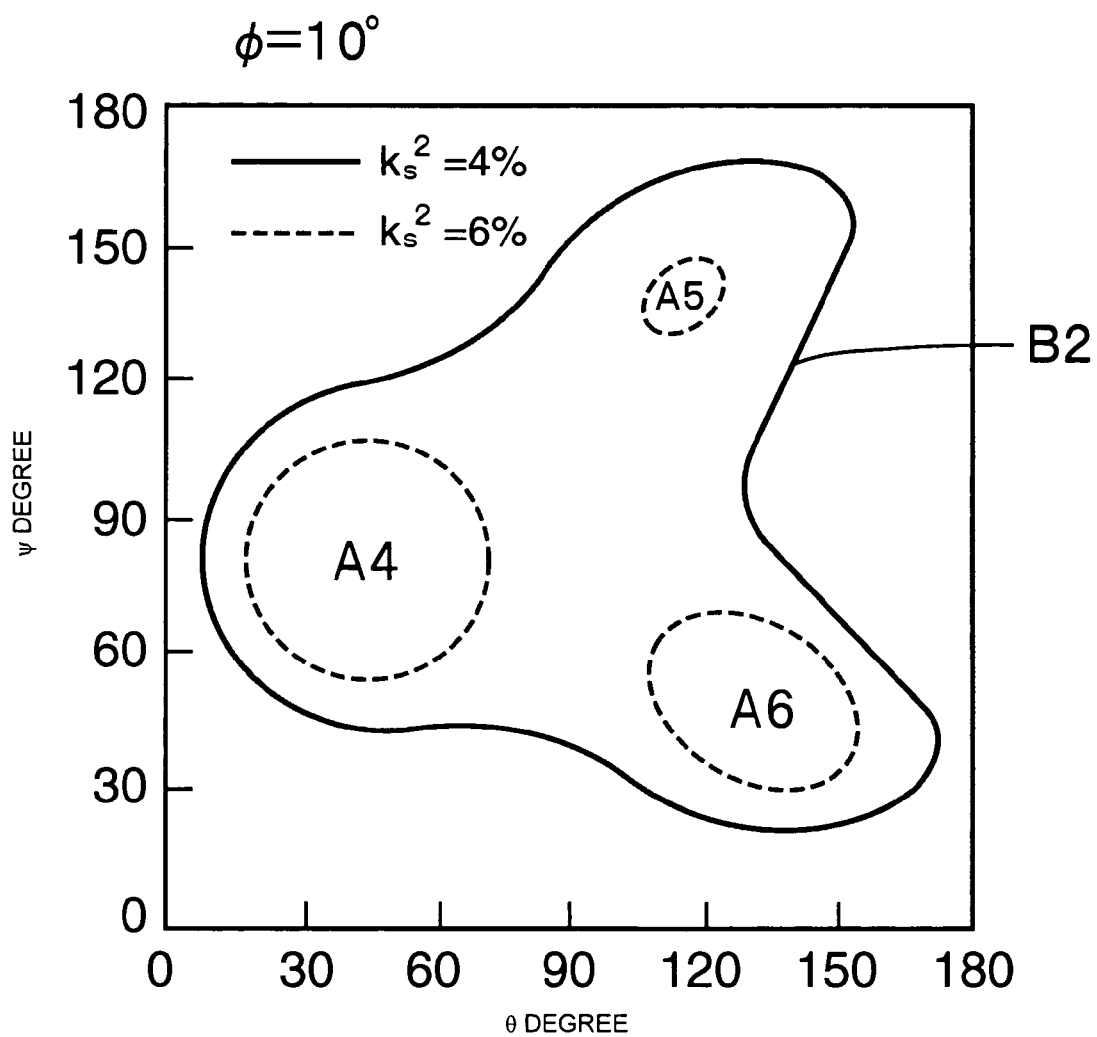
FIG. 9 illustrates regions of Euler angles at which the electromechanical coupling coefficient $k_S^2$ of second leaky surface acoustic waves having the $u_1$ component as the dominant component is at least about 4% and at least about 6%, the second leaky surface acoustic waves propagating in a structure that includes a (10°, θ, ψ)-cut LiTaO$_3$ substrate and a silver conductive film having a normalized thickness H/λ of about 0.03.
Figure 10:
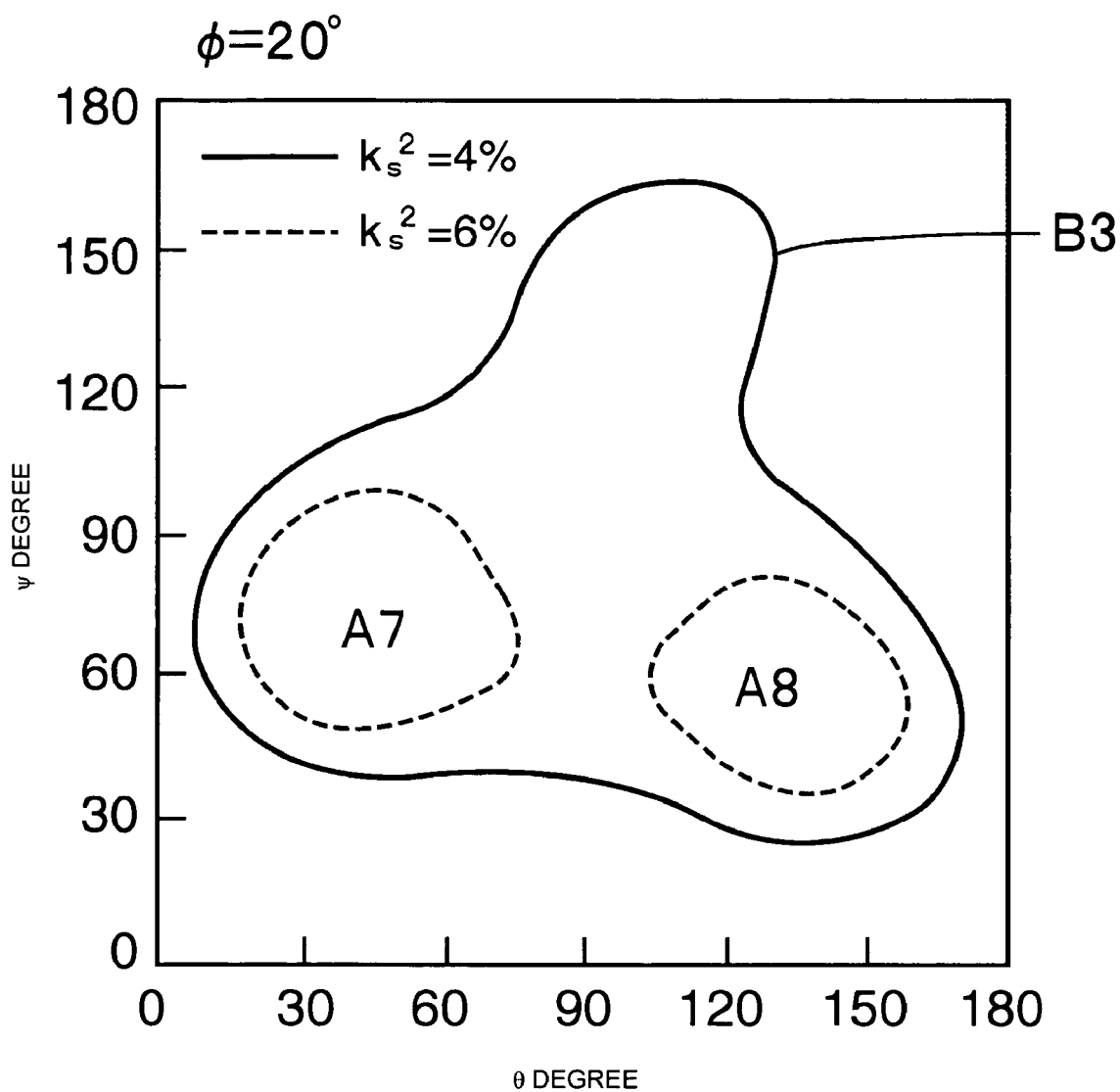
FIG. 10 illustrates regions of Euler angles at which the electromechanical coupling coefficient $k_S^2$ of second leaky surface acoustic waves having the $u_1$ component as the dominant component is at least about 4% and at least about 6%, the second leaky surface acoustic waves propagating in a structure that includes a (20°, θ, ψ)-cut LiTaO$_3$ substrate and a silver conductive film having a normalized thickness H/λ of about 0.03.
Figure 11:
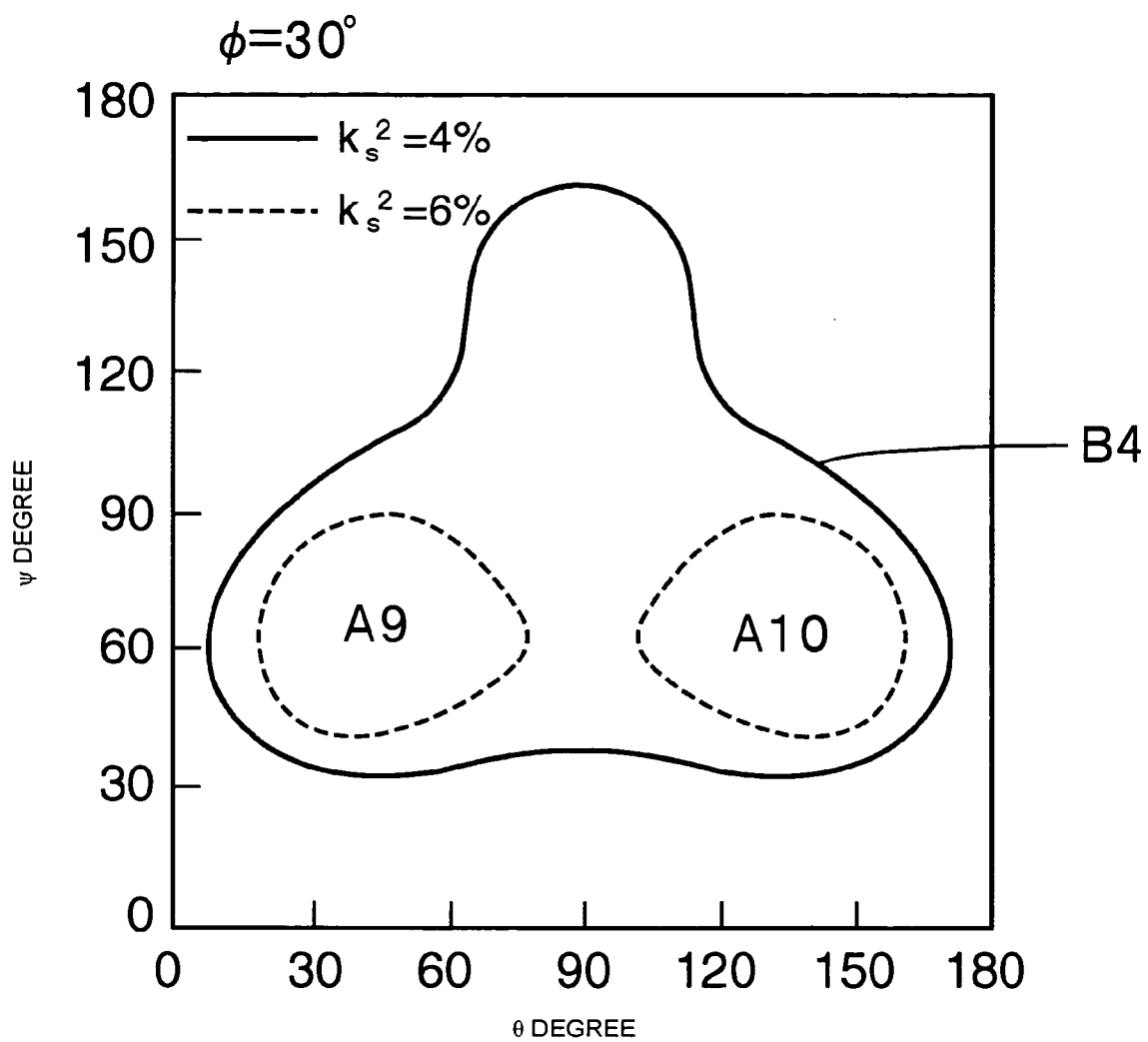
FIG. 11 illustrates regions of Euler angles at which the electromechanical coupling coefficient $k_S^2$ of second leaky surface acoustic waves having the $u_1$ component as the dominant component is at least about 4% and at least about 6%, the second leaky surface acoustic waves propagating in a structure that includes a (30°, θ, ψ)-cut LiTaO$_3$ substrate and a silver conductive film having a normalized thickness H/λ of about 0.03.

FIGS. 8 to 11 show regions of Euler angles at which the electromechanical coupling coefficient $k_s^2$ of second leaky surface acoustic waves having the $u_1$ component as the dominant component was at least about 4% and at least about 6%. Here, the second leaky surface acoustic waves propagated in a structure including a LiTaO₃ substrate cut at an Euler angle of (φ, θ, ψ) and a silver conductive film having a normalized thickness H/λ of 0.03. In FIG. 8, φ=0°; in FIG. 9, φ=10°; in FIG. 10, φ=20°; and in FIG. 11, φ=30°.

In FIGS. 8 to 11, regions A1 to A10 defined by broken lines show the ranges of Euler angles that achieved electromechanical coupling coefficient $k_s^2$ of at least about 6%. The regions A1 to A10 were defined by connecting coordinates P1 to P5 in order shown in Tables 8 and 9 below. Regions B1 to B4 defined by solid lines show the ranges of Euler angles that achieved electromechanical coupling coefficient $k_S^2$ of at least about 4%.

TABLE 8

| Region | Coordinates | θ | ψ |
|---|---|---|---|
| A1 | P1 | 16.2 | 63.7 |
|  | P2 | 69.9 | 63.7 |
|  | P3 | 69.9 | 116.3 |
|  | P4 | 16.2 | 116.3 |
|  | P5 | 16.2 | 63.7 |
| A2 | P1 | 106.2 | 118.7 |
|  | P2 | 143.6 | 118.7 |
|  | P3 | 143.6 | 151.4 |
|  | P4 | 106.2 | 151.4 |
|  | P5 | 106.2 | 118.7 |
| A3 | P1 | 106.2 | 28.6 |
|  | P2 | 143.6 | 28.6 |
|  | P3 | 143.6 | 61.3 |
|  | P4 | 106.2 | 61.3 |
|  | P5 | 106.2 | 28.6 |
| A4 | P1 | 16.5 | 55.9 |
|  | P2 | 72.3 | 55.9 |
|  | P3 | 72.3 | 108.0 |
|  | P4 | 16.5 | 108.0 |
|  | P5 | 16.5 | 55.9 |
| A5 | P1 | 106.2 | 131.3 |
|  | P2 | 124.0 | 131.3 |
|  | P3 | 124.0 | 148.0 |
|  | P4 | 106.2 | 148.0 |
|  | P5 | 106.2 | 131.3 |

TABLE 9

| Region | Coordinates | θ | ψ |
|---|---|---|---|
| A6 | P1 | 106.3 | 30.8 |
|  | P2 | 153.1 | 30.8 |
|  | P3 | 153.1 | 71.7 |
|  | P4 | 106.3 | 71.7 |
|  | P5 | 106.3 | 30.8 |
| A7 | P1 | 17.4 | 48.5 |
|  | P2 | 76.8 | 48.5 |
|  | P3 | 76.8 | 99.4 |
|  | P4 | 17.4 | 99.4 |
|  | P5 | 17.4 | 48.5 |
| A8 | P1 | 104.6 | 35.6 |
|  | P2 | 158.0 | 35.6 |
|  | P3 | 158.0 | 81.3 |
|  | P4 | 104.6 | 81.3 |
|  | P5 | 104.6 | 35.6 |
| A9 | P1 | 19.1 | 41.7 |
|  | P2 | 78.3 | 41.7 |
|  | P3 | 78.3 | 90.4 |
|  | P4 | 19.1 | 90.4 |
|  | P5 | 19.1 | 41.7 |
| A10 | P1 | 101.7 | 41.7 |
|  | P2 | 161.0 | 41.7 |
|  | P3 | 161.0 | 90.4 |
|  | P4 | 101.7 | 90.4 |
|  | P5 | 101.7 | 41.7 |

In FIGS. 8 to 11, φ is 0°, 10°, 20°, and 30°, respectively. According to the relationships (A), the Euler angle (90°, 90°, 31°) is equivalent to (90°, 90°, 149°), and the Euler angle (90°, 31°, 116°) is equivalent to (30°, 149°, 64°).

As shown in FIGS. 8 to 11, the regions with high electromechanical coupling coefficient $k_S^2$ change continuously. Accordingly, substantially the same electromechanical coupling coefficient $k_S^2$ will be achieved in the regions A1 to A10 and B1 to B4 when φ is 0°±5°, 10°±5°, 20°±5° and 30°±5°.

Similarly, the Euler angles that achieve large electromechanical coupling coefficients when the normalized thickness H/λ of the conductive film was about 0.03 were investigated with conductive films made of gold, copper, and aluminum. The results indicated that although there was a difference in the absolute value of the electromechanical coupling coefficient $k_S^2$, large electromechanical coupling coefficients $k_S^2$ existed in the regions A1 to A10 and B1 to B4 shown in FIGS. 8 to 11. With the conductive film composed of aluminum, however, the regions A1 to A10 were detected, but regions B1 to B4 were not detected.

Figure 12:
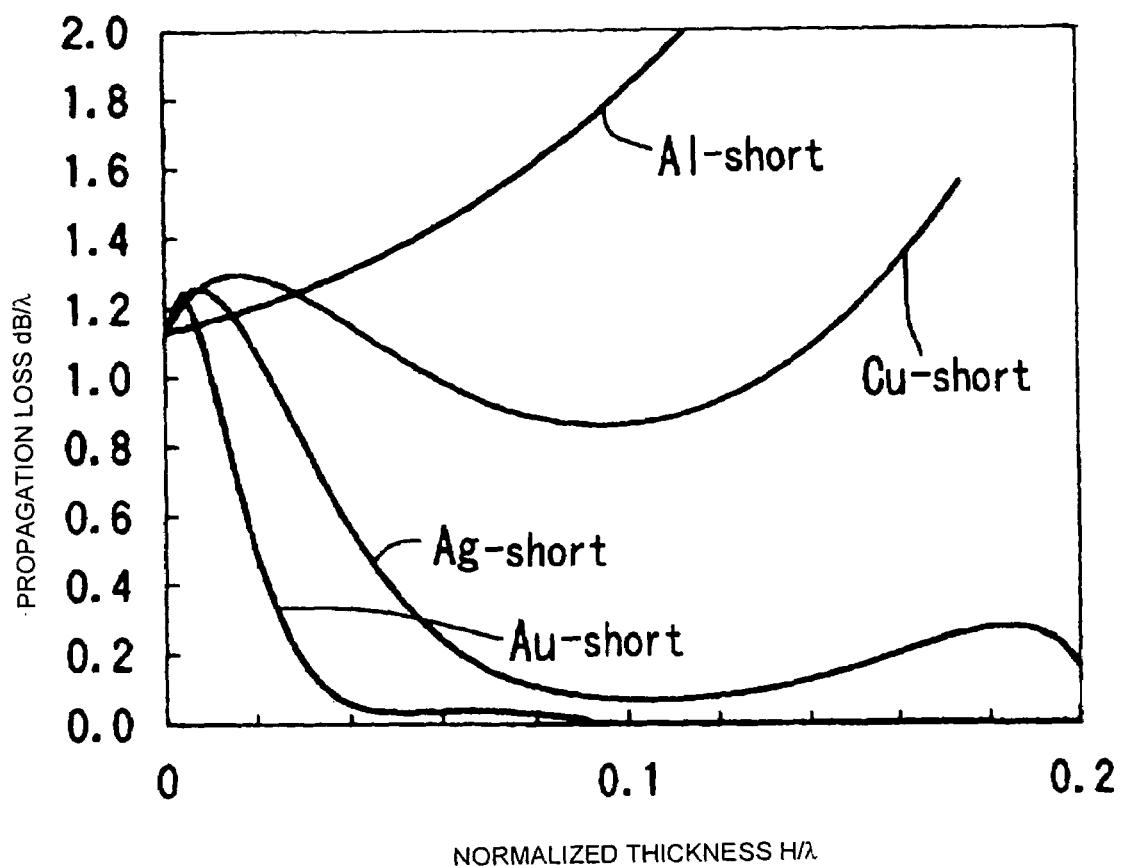
FIG. 12 is a graph that explains propagation losses a of second leaky surface acoustic waves having the $u_1$ component as the dominant component, the second leaky surface acoustic waves propagating in structures that include (90°, 31°, 116°)-cut LiTaO$_3$ substrates and aluminum, gold, silver, and copper conductive films having a normalized thickness H/λ.

FIG. 12 is a graph showing a propagation loss a of second leaky surface acoustic waves, whose dominant component is the $u_1$ component, on a metallized surface. Here, the second leaky surface acoustic waves primarily composed of $u_1$ component propagate in structures including (90°, 31°, 116°)-cut $LiTaO_3$ substrates and conductive films composed of aluminum, gold, silver, and copper having a normalized thickness of H/λ.

In general, surface acoustic waves having an acoustic velocity less than that of three bulk waves, namely, "slow shear waves", "fast shear waves", and "longitudinal waves", propagating in piezoelectric substrates do not suffer from propagation losses. The acoustic velocities of the bulk waves propagating in (90°, 31°, 116°)-cut $LiTaO_3$ substrates are as follows: slow shear waves=about 3,352 m/sec; fast shear waves=about 3,375 m/sec; and longitudinal waves=about 6,287 m/sec. When the conductive film is composed of gold, the acoustic velocity of the surface acoustic waves is less than about 3,352 m/sec, and thus, the propagation loss α is approximately zero at a H/λ of less than about 0.097, according to FIG. 6. However, since the acoustic velocity is less than about 3,352 m/sec, the width of the electrode fingers of IDTs and grating reflectors must be decreased in order for the structure to be used as RF-band filters. Thus, this structure is not practical.

On the other hand, as shown in FIG. 12, the propagation loss a decreases with increasing density of the conductive film. Moreover, the propagation losses of materials, such as copper or silver, which have lower densities than gold, have local minima at certain H/λ values. In the gold conductive layer, the local minimum of the propagation loss α is in the range of H/λ=about 0.02 to about 0.04 in the regions that achieve large electromechanical coupling coefficient $k_S^2$, in particular, the regions A1 to A10 with $k_S^2$>about 6%. In the silver conductive layer, the local minimum of the propagation loss a lies in the range of H/λ=about 0.05 to about 0.12. In the copper conductive layer, the local minimum of the propagation loss a lies in the range of H/λ=about 0.06 to about 0.15. When gold or silver is used, the propagation loss is decreased to about 0.1 dB/λ or less at an acoustic velocity of approximately 5,000 m/sec, i.e. a velocity between those of the longitudinal waves and the fast shear waves. No conditions that would give local minima to the propagation loss curves were identified when aluminum was used in the conductive film.

The examples above reveal that second leaky surface acoustic waves having a longitudinal component as the dominant component tend to have small propagation loss in a substrate provided with gratings, such as IDTs and reflectors, although the propagation loss a is large in a substrate with a plain conductive film. This is presumably due to the fact that gratings decrease the acoustic velocity. Moreover, copper, silver, and gold having larger density than aluminum have less propagation losses in the structure including a substrate and a conductive film. Thus, further reduction in propagation loss is achieved by using a combination of these materials and gratings.

It is a well-known fact that the temperature coefficient of delay (TCD) in the above-described LiTaO3 substrate is large, i.e., about 20 ppm to about 50 ppm. A method for improving the TCD of the leaky surface acoustic waves by forming a $SiO_2$ film has been proposed in "Purazuma CVD Hou SiO₂ Maku Wo Mochiita Soujo Kozo Dansei Hyomenha Kiban (Layered SAW Substrate Using SiO₂ Film And Plasma-Enhanced CVD)", Nakajo et al., Institute of Electronics, Information, and Communication Engineers, Acoustic Wave Study Group, Material US80-3 (1980). This method can be effectively applied to SAWs whose dominant component is the longitudinal component. In particular, the TCD is improved by forming a SiO₂ film on the IDT by sputtering or other suitable method. The thickness of the conductive film that forms the IDT is preferably thin to improve step coverage and to prevent abnormal growth of SiO₂ film at side walls of electrode fingers. Thus, high-density conductive films made of copper, silver, gold, or other suitable material are preferred over an aluminum conductor film since the thickness of the copper, silver, or gold conductive films can be made smaller.

Figure 13:
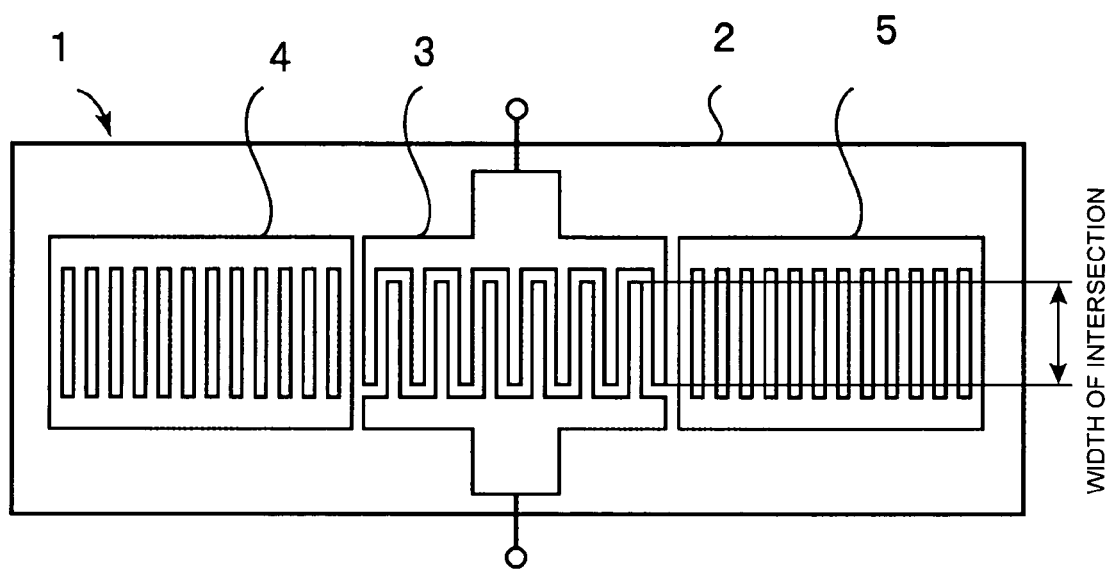
FIG. 13 is a schematic plan view of an example structure of a SAW device implementing the present invention.

The structure of the SAW device of the present invention is not particularly limited as long as the device includes a LiTaO₃ substrate cut at a particular Euler angle and an electrode film. An example of the device is shown in FIG. 13. FIG. 13 is a schematic plan view of a one-port SAW resonator incorporating preferred embodiments of the present invention. A SAW device 1, i.e., a one-port SAW resonator, has a LiTaO₃ substrate 2 cut at a particular Euler angle. An IDT 3 and reflectors 4 and 5 are disposed on the LiTaO₃ substrate. Preferred embodiments of the present invention may also be incorporated into a ladder filter including a plurality of SAW resonators connected in parallel and in series, various resonator filters, and transversal SAW filters.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A surface acoustic wave device using second leaky surface acoustic waves having a dominant component which is a longitudinal wave component, the device comprising:
   a LiTaO₃ substrate; and
   a conductive film disoosed on the LiTaO₃ substrate; wherein
   the density $\rho$ of the conductive film is in the range of about 2,699 kg/m³ to about 19.300 kg/m³; and
   the normalized thickness H/λ of the conductive film is within the range of about $5.3023 \times \rho^{-0.4172}$ to about $80161 \times \rho^{-1.781}$ wherein λ represents the wavelength of second leaky surface acoustic waves and H represents the thickness of the conductive film.

2. The device according to claim 1, wherein the Euler angle of the LiTaO₃ substrate is in regions B1 to B4 shown in FIGS. 8 to 11.

3. The device according to claim 1, wherein the conductive film comprises at least one of copper and silver.

4. A surface acoustic wave device using second leaky surface acoustic waves the dominant component of which is a longitudinal wave component, the device comprising:
   a LiTaO₃ substrate having an Euler angle within regions A1 to A10 defined by connecting the coordinates shown in Tables 1 and 2; and
   a conductive film disposed on the LiTaO₃ substrate, wherein the density $\rho$ of the conductive film is greater than about 2,699 kg/m³ and the normalized thickness H/λ of the conductive film is within the range of about $5.3023 \times \rho^{-0.4172}$ to about $80161 \times \rho^{-1.781}$ wherein λ represents the wavelength of the second leaky surface acoustic waves and H represents the thickness of the conductive film:

TABLE 1

| Region | Coordinates | θ | ψ |
|---|---|---|---|
| A1 | P1 | 16.2 | 63.7 |
|    | P2 | 69.9 | 63.7 |
|    | P3 | 69.9 | 116.3 |
|    | P4 | 16.2 | 116.3 |
|    | P5 | 16.2 | 63.7 |
| A2 | P1 | 106.2 | 118.7 |
|    | P2 | 143.6 | 118.7 |
|    | P3 | 143.6 | 151.4 |
|    | P4 | 106.2 | 151.4 |
|    | P5 | 106.2 | 118.7 |
| A3 | P1 | 106.2 | 28.6 |
|    | P2 | 143.6 | 28.6 |
|    | P3 | 143.6 | 61.3 |
|    | P4 | 106.2 | 61.3 |
|    | P5 | 106.2 | 28.6 |
| A4 | P1 | 16.5 | 55.9 |
|    | P2 | 72.3 | 55.9 |
|    | P3 | 72.3 | 108.0 |
|    | P4 | 16.5 | 108.0 |
|    | P5 | 16.5 | 55.9 |
| A5 | P1 | 106.2 | 131.3 |
|    | P2 | 124.0 | 131.3 |
|    | P3 | 124.0 | 148.0 |
|    | P4 | 106.2 | 148.0 |
|    | P5 | 106.2 | 131.3 |

TABLE 2

| Region | Coordinates | θ | ψ |
|---|---|---|---|
| A6 | P1 | 106.3 | 30.8 |
|    | P2 | 153.1 | 30.8 |
|    | P3 | 153.1 | 71.7 |
|    | P4 | 106.3 | 71.7 |
|    | P5 | 106.3 | 30.8 |
| A7 | P1 | 17.4 | 48.5 |
|    | P2 | 76.8 | 48.5 |
|    | P3 | 76.8 | 99.4 |
|    | P4 | 17.4 | 99.4 |
|    | P5 | 17.4 | 48.5 |
| A8 | P1 | 104.6 | 35.6 |
|    | P2 | 158.0 | 35.6 |
|    | P3 | 158.0 | 81.3 |
|    | P4 | 104.6 | 81.3 |
|    | P5 | 104.6 | 35.6 |
| A9 | P1 | 19.1 | 41.7 |
|    | P2 | 78.3 | 41.7 |
|    | P3 | 78.3 | 90.4 |
|    | P4 | 19.1 | 90.4 |
|    | P5 | 19.1 | 41.7 |
| A10 | P1 | 101.7 | 41.7 |
|    | P2 | 161.0 | 41.7 |
|    | P3 | 161.0 | 90.4 |
|    | P4 | 101.7 | 90.4 |
|    | P5 | 101.7 | 41.7 |

5. The device according to claim 4, wherein the conductive film comprises at least one of copper, silver, and gold.

6. A surface acoustic wave device according to claim 1, wherein the conductive film defines at least one of an interdigital transducer and a grating reflector.

* * * * *